(12) United States Patent
Yu et al.

(10) Patent No.: US 8,507,938 B2
(45) Date of Patent: Aug. 13, 2013

(54) LIGHT-EMITTING DIODE STRUCTURE AND METHOD FOR MANUFACTURING THE SAME

(75) Inventors: Kuo-Hui Yu, Tainan County (TW); Tsung-Hung Lu, Tainan County (TW); Chang-Hsin Chu, Tainan County (TW)

(73) Assignee: Chi Mei Lighting Technology Corp., Tainan (TW)

( * ) Notice: Subject to any disclaimer, the term of this patent is extended or adjusted under 35 U.S.C. 154(b) by 678 days.

(21) Appl. No.: 12/753,106

(22) Filed: Apr. 2, 2010

(65) Prior Publication Data
US 2011/0006326 A1    Jan. 13, 2011

(30) Foreign Application Priority Data

Jul. 10, 2009  (TW) ................................ 98123498 A (51) Int. Cl.
*H01L 33/00*      (2010.01)
(52) U.S. Cl.
USPC ............................................ 257/99; 257/98
(58) Field of Classification Search
None
See application file for complete search history.

(56) References Cited

U.S. PATENT DOCUMENTS

| | | | |
|---|---|---|---|
| 2005/0104081 A1* | 5/2005 | Kim et al. | 257/99 |
| 2006/0128118 A1* | 6/2006 | Nagahama et al. | 438/458 |

* cited by examiner

*Primary Examiner* — Chuong A Luu
*Assistant Examiner* — Cory Eskridge
(74) *Attorney, Agent, or Firm* — CKC & Partners Co., Ltd.

(57) ABSTRACT

A light-emitting diode (LED) structure and a method for manufacturing the same are described. The light-emitting diode structure includes a p-type electrode, a bonding substrate, a p-type semiconductor layer, an active layer, an n-type semiconductor layer, an epitaxial growth substrate and an n-type electrode. The bonding substrate is disposed on the p-type electrode. The p-type semiconductor layer is disposed on the bonding substrate. The active layer is disposed on the p-type semiconductor layer. The n-type semiconductor layer is disposed on the active layer. The epitaxial growth substrate is disposed on the n-type semiconductor layer, wherein the epitaxial growth substrate includes an opening penetrating the epitaxial growth substrate. The n-type electrode is disposed in the opening and is electrically connected to the n-type semiconductor layer.

9 Claims, 6 Drawing Sheets

LIGHT-EMITTING DIODE STRUCTURE AND METHOD FOR MANUFACTURING THE SAME

RELATED APPLICATIONS

This application claims priority to Taiwan Application Ser. No. 98123498, filed Jul. 10, 2009, which is herein incorporated by reference.

FIELD OF THE INVENTION

The present invention relates to a light-emitting device, and more particularly to a light-emitting diode (LED) structure and a method for manufacturing the same.

BACKGROUND OF THE INVENTION

Currently, in the manufacturing of a GaN-based vertical structure light-emitting diode, after an illuminant epitaxial structure is formed on an epitaxial growth substrate, the epitaxial growth substrate is usually removed by a laser lift-off technique. The growth substrate is typically a sapphire substrate composed of $Al_2O_3$.

However, a large lattice mismatch exists between the $Al_2O_3$ and the GaN-based material, so that when the growth substrate is removed by a laser lift-off technique, a large stress is induced. In addition, the illuminant epitaxial structure may absorb the laser energy. Accordingly, the illuminant epitaxial structure is damaged to greatly reduce the illumination efficiency, the reliability and the process yield of the light-emitting diode device.

SUMMARY OF THE INVENTION

Therefore, one aspect of the present invention is to provide a method for manufacturing a light-emitting diode structure, in which only a portion of an epitaxial growth substrate is removed. Therefore, the stress induced when the epitaxial growth substrate is removed can be greatly reduced, thereby effectively decreasing the damage of an epitaxial structure caused when the epitaxial growth substrate is removed.

Another aspect of the present invention is to provide a method for manufacturing a light-emitting diode structure, in which the laser only contacts a small portion of an epitaxial structure or an etching material layer, so that the damage to the epitaxial structure can be greatly eliminated to increase the process yield.

Still another aspect of the present invention is to provide a light-emitting diode structure having superior illumination efficiency and high reliability.

According to the aforementioned aspects, the present invention provides a light-emitting diode structure. The light-emitting diode structure includes a p-type electrode, a bonding substrate, a p-type semiconductor layer, an active layer, an n-type semiconductor layer, an epitaxial growth substrate and an n-type electrode. The bonding substrate is disposed on the p-type electrode. The p-type semiconductor layer is disposed on the bonding substrate. The active layer is disposed on the p-type semiconductor layer. The n-type semiconductor layer is disposed on the active layer. The epitaxial growth substrate is disposed on the n-type semiconductor layer, wherein the epitaxial growth substrate includes an opening penetrating the epitaxial growth substrate. The n-type electrode is disposed in the opening and electrically connected to the n-type semiconductor layer.

According to an embodiment of the present invention, the light-emitting diode structure further includes an insulation layer disposed on the bonding substrate under the opening and a metal layer disposed on the insulation layer, wherein the opening exposes the metal layer. In addition, the metal layer includes a first portion and two second portions, and the second portions are respectively connected to two opposite sides of the first portion to form a U-like shape structure.

According to the aforementioned aspects, the present invention further provides a method for manufacturing a light-emitting diode structure including the following steps. An epitaxial growth substrate is provided, wherein a surface of the epitaxial growth substrate is covered with an n-type semiconductor layer, an active layer and a p-type semiconductor layer in sequence. A first surface of a bonding substrate is bonded to the p-type semiconductor layer, wherein the bonding substrate further includes a second surface opposite to the first surface. A slit is formed to penetrate the epitaxial growth substrate to at least expose a first portion of the n-type semiconductor layer. An etching step is performed to etch the first portion of the n-type semiconductor layer through the slit by using an etchant to make a portion of the epitaxial growth substrate overhanging the n-type semiconductor layer. At least one portion of the overhanging portion of the epitaxial growth substrate is removed to form an opening in the epitaxial growth substrate, wherein the opening exposes a second portion of the n-type semiconductor layer. An n-type electrode is formed on the exposed second portion of the n-type semiconductor layer. A p-type electrode is formed on the second surface of the bonding substrate.

According to an embodiment of the present invention, the step of forming the slit and the step of removing the portion of the overhanging portion of the epitaxial growth substrate may be performed by laser, and the etching step may be a wet etching step.

According to the aforementioned aspects, the present invention further provides a method for manufacturing a light-emitting diode structure including the following steps. An epitaxial growth substrate is provided, wherein a surface of the epitaxial growth substrate is covered with an n-type semiconductor layer, an active layer and a p-type semiconductor layer in sequence. A patterning step is performed to remove a portion of the p-type semiconductor layer and a portion of the active layer until at least exposing a portion of the n-type semiconductor layer to form a first opening. A metal layer is formed on a bottom surface of the first opening, wherein the metal layer is electrically connected to the n-type semiconductor layer, and an etching material layer is disposed between the surface of the epitaxial growth substrate and the metal layer. An insulation layer is formed to fill the first opening. A first surface of a bonding substrate is bonded to the p-type semiconductor layer, wherein the bonding substrate further includes a second surface opposite to the first surface. A slit is formed to penetrate the epitaxial growth substrate to at least expose a portion of the etching material layer. An etching step is performed to etch the etching material layer through the slit by using an etchant to make a portion of the epitaxial growth substrate overhanging the metal layer. At least one portion of the overhanging portion of the epitaxial growth substrate is removed to form a second opening in the epitaxial growth substrate, wherein the second opening exposes a portion of the metal layer. An n-type electrode is formed on the exposed portion of the metal layer. A p-type electrode is formed on the second surface of the bonding substrate.

According to an embodiment of the present invention, the metal layer includes a first portion and two second portions extending respectively from two opposite sides of the first portion to the epitaxial growth substrate.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Refer to FIG. 1A through FIG. 1F. FIG. 1A through FIG. 1F are schematic flow diagrams showing a process for manufacturing a light-emitting diode structure in accordance with an embodiment of the present invention. In the manufacturing of a light-emitting diode structure, an epitaxial growth substrate 100 is firstly provided. The epitaxial growth substrate 100 includes surfaces 102 and 104 on opposite sides. The material of the epitaxial growth substrate 100 may be $Al_2O_3$. In one embodiment, the epitaxial growth substrate 100 may be a sapphire substrate composed of $Al_2O_3$. Then, an n-type semiconductor layer 106, an active layer 108 and a p-type semiconductor layer 110 are formed on surface 102 of the epitaxial growth substrate 100 in sequence by, for example, an epitaxial growth method. In one embodiment, the materials of the n-type semiconductor layer 106, the active layer 108 and the p-type semiconductor layer 110 may be GaN-based materials, such as InAlGaN. In addition, the active layer 108 may include a multi-quantum well (MQW) structure, for example.

Figure 1A:
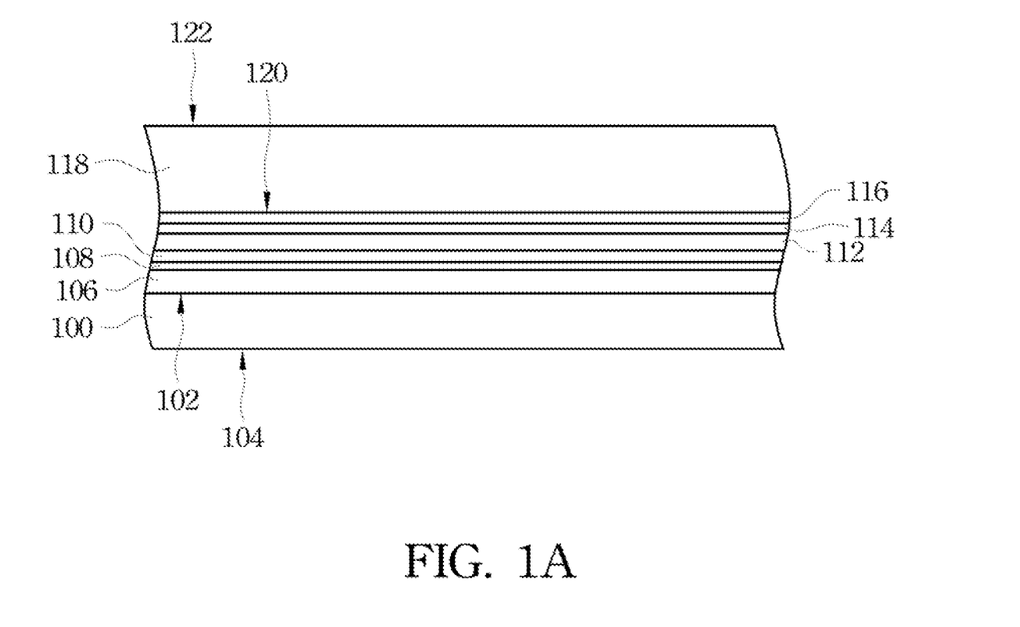
FIG. 1A through FIG. 1F are schematic flow diagrams showing a process for manufacturing a light-emitting diode structure in accordance with an embodiment of the present invention.

Next, a p-type contact layer 112 may be selectively formed on the p-type semiconductor layer 110 so that an ohmic contact may be formed between the p-type contact layer 112 and the p-type semiconductor layer 110. The p-type contact layer 112 may be a single-layered structure or a multi-layered structure. In one embodiment, the material of the p-type contact layer 112 may be Ni/Au, Ni/Ag, ITO, ZnO, GZO, AZO or $In_2O_3$. Furthermore, according to the product requirement, a reflective layer 114 may be selectively formed on the p-type contact layer 112 to reflect the light emitted from the active layer 108. The material of the reflective layer 114 may include metal of high reflectivity, such as Al, Ag or Pt.

In addition, according to the process requirement, a bonding layer 116 may be selectively formed to bond the reflective layer 114 on the p-type semiconductor layer 110 and the bonding substrate 118. The bonding layer 116 may be firstly formed either on the reflective layer 114 on the p-type semiconductor layer 110, or on the surface 120 of the bonding substrate 118. The bonding layer 116 may be a single-layered metal structure or a multi-layered metal structure. Then, such as shown in FIG. 1A, the surface 120 of the bonding substrate 118 may be bonded to the reflective layer 114 on the p-type semiconductor layer 110 by the bonding layer 116. The bonding substrate 118 further includes another surface 122, wherein the surfaces 122 and 120 are respectively on two opposite sides of the bonding substrate 118. The material of the bonding substrate 118 may be a material of large thermal conductivity, such as metal, a semiconductor material, or a metal and semiconductor compound material. In one embodiment, the material of the bonding substrate 118 may include, for example, Si, Mo, Cu, Ni, Al, CuW or any combinations of the above-mentioned materials.

In some embodiments, after completing the bonding process of the bonding substrate 118 and the p-type semiconductor layer 110, a polishing step may be selectively performed on the surface 104 of the epitaxial growth substrate 100 to decrease the thickness of the epitaxial growth substrate 100 according to the product requirement. In one embodiment, the thickness of the polished epitaxial growth substrate 100 may range between 1 μm and 300 μm.

Figure 1B:
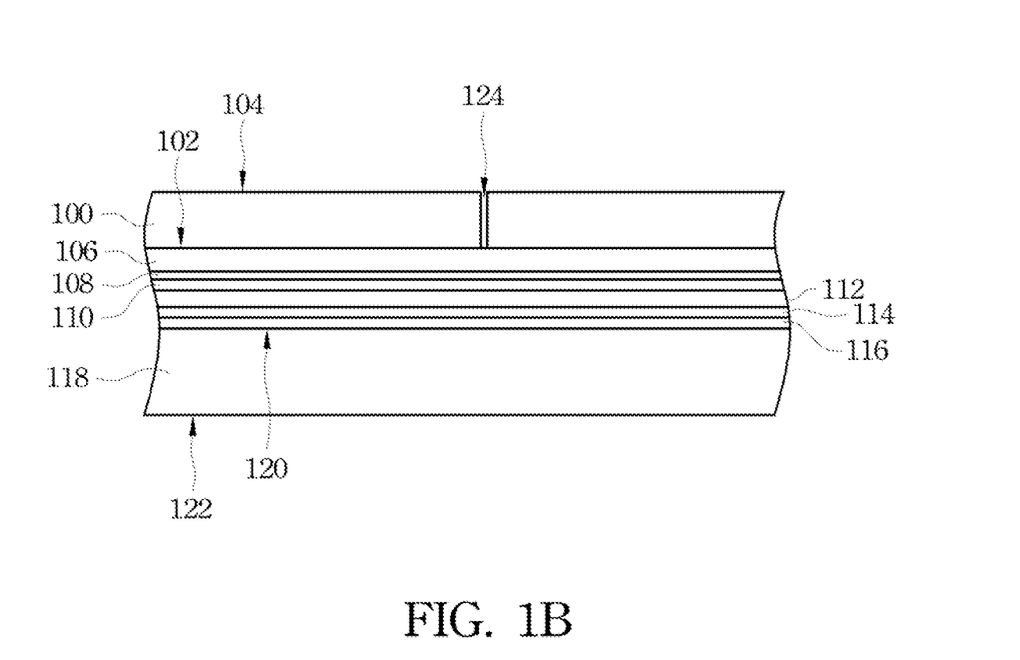

In order to illustrate the sequential process clearly, FIG. 1B to FIG. 1F illustrate the diagrams when FIG. 1A is turned upside down. Next, such as shown in FIG. 1B, a portion of the epitaxial growth substrate 100 is slit from the surface 104 of the epitaxial growth substrate 100 by, for example, laser to form a slit 124 penetrating the epitaxial growth substrate 100. In the present embodiment, the slit 124 exposes a portion of the n-type semiconductor layer 106. In one embodiment, the width 140 of the slit 124 may range between 1 μm and 50 μm, for example. In the embodiment shown in FIG. 1B, the slit 124 does not extend into the n-type semiconductor layer 106. In another embodiment, the slit 124 may extend into the n-type semiconductor layer 106.

Figure 1C:
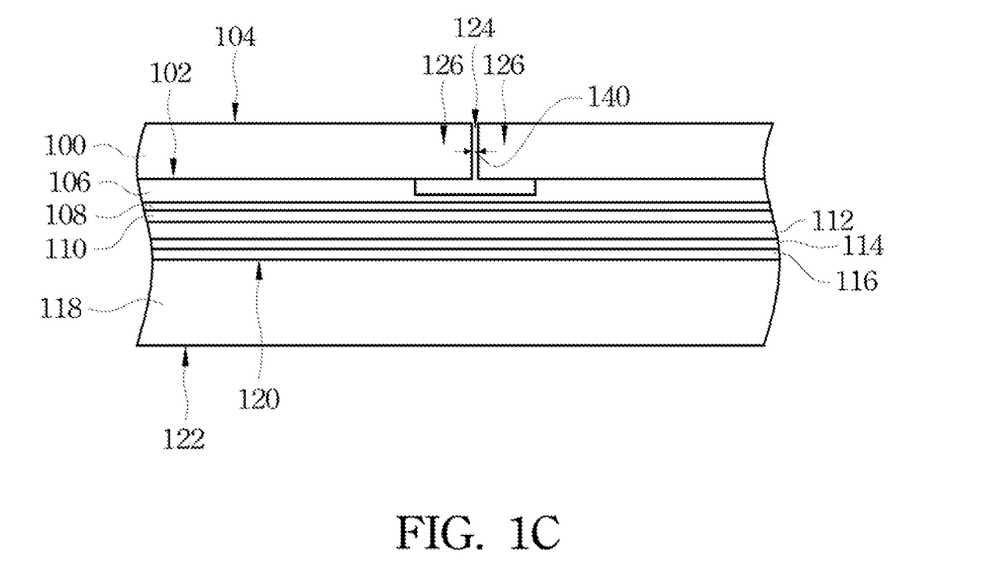

Then, an etching step is performed to etch the n-type semiconductor layer 106 through the slit 124 by an etchant. In one embodiment, the etching step may use, for example, a wet etching method, and the etchant enters the slit 124 to etch the exposed portion of the n-type semiconductor layer 106. The etchant may flow along the interface between the epitaxial growth substrate 100 and the n-type semiconductor layer 106 to laterally etch and remove a portion of the n-type semiconductor layer 106 from a bottom surface of the slit 124 toward the outer of the slit 124. The etching step is performed until a portion of the epitaxial growth substrate 100 near the slit 124 overhangs the n-type semiconductor layer 106 to form an overhang 126, such as shown in FIG. 1C. In one embodiment, the etchant may be a combination composed of $H_2SO_4$ and $H_3PO_4$, KOH or NaOH.

Figure 1D:
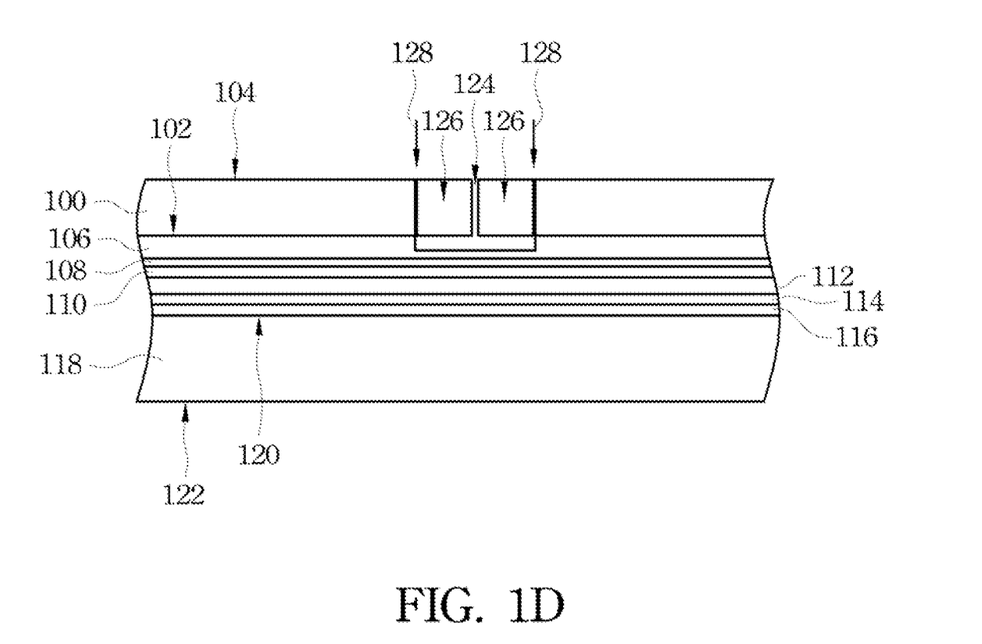

Next, such as shown in FIG. 1D, the overhang 126 of the epitaxial growth substrate 100 may be cut off by laser 128 to remove the overhang 126 of the epitaxial growth substrate 100 to form an opening 132 in the epitaxial growth substrate 100. In the embodiment shown in FIG. 1D, the entire overhang 126 of the epitaxial growth substrate 100 is removed. In another embodiment, the overhang 126 of the epitaxial growth substrate 100 is not removed completely, and a portion of the overhang 126 may overhang the opening 132.

Figure 1E:
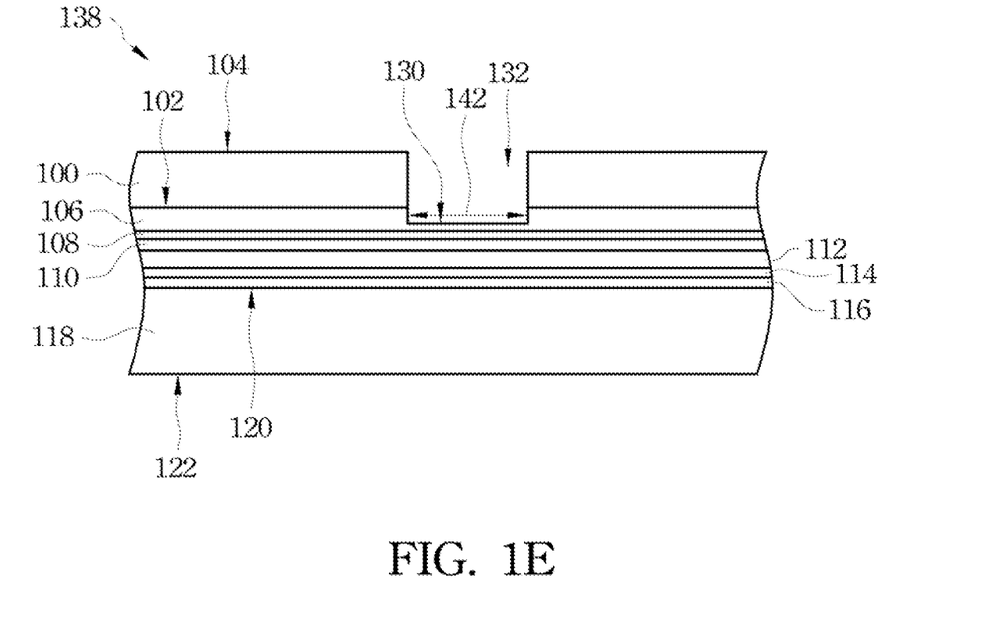

After the overhang 126 of the epitaxial growth substrate 100 is removed, the opening 132 exposes a portion 130 of the n-type semiconductor layer 106, such as shown in FIG. 1E. The width 142 of the exposed portion 130 of the n-type semiconductor layer 106 may be larger than 30 μm, for example.

Figure 1F:
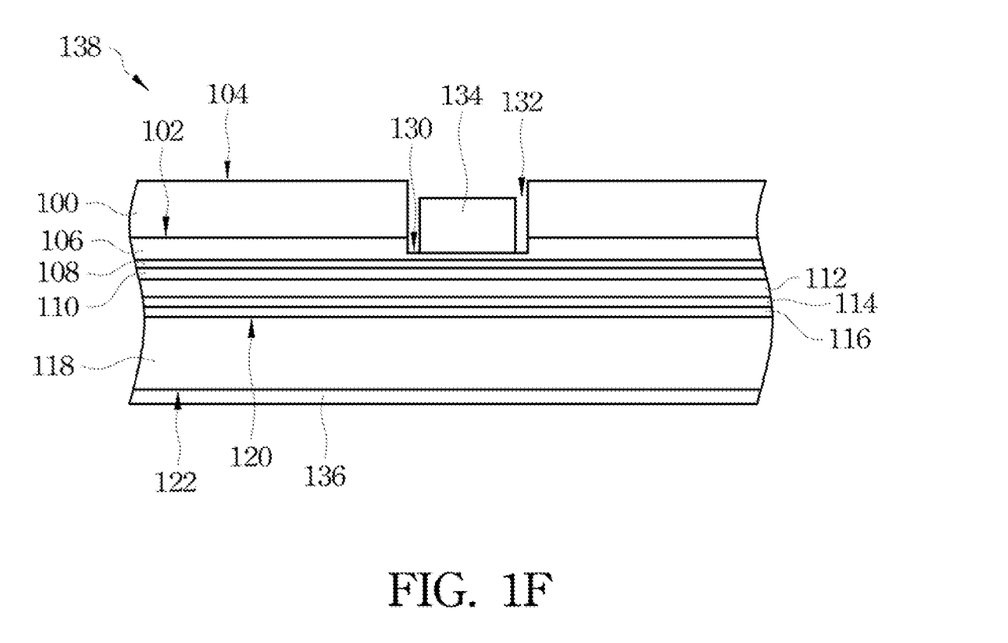

Then, the bonding substrate 118 may be selectively polished from the surface 122 of the bonding substrate 118 to reduce the thickness of the bonding substrate 118 according to the product requirement. Subsequently, such as shown in FIG. 1F, an n-type electrode 134 and a p-type electrode 136 are formed by, for example, an evaporation method to complete the fabrication of a light-emitting diode structure 138. In one embodiment, the n-type electrode 134 may only be disposed on the exposed portion 130 of the n-type semiconductor layer 106, such as shown in FIG. 1F. In another embodiment, a portion of the n-type electrode 134 may be disposed on the exposed portion of the n-type semiconductor layer 106, and another portion of the n-type electrode 134 may be disposed on the surface 104 of the epitaxial growth substrate 100. The n-type electrode 134 is electrically connected to the n-type semiconductor layer 106 and is preferably in ohmic contact with the n-type semiconductor layer 106. The p-electrode 136 covers the surface 122 of the bonding substrate 118. The p-electrode 136 is electrically connected to the bonding substrate 118 and is preferably in ohmic contact with the bonding substrate 118. The p-electrode 136 may include a eutectic layer, and a material of the eutectic layer may be, for example, AuSn, AgSn, AuSnCu or AgSnCu.

Refer to FIG. 2A through FIG. 2F. FIG. 2A through FIG. 2F are schematic flow diagrams showing a process for manufacturing a light-emitting diode structure in accordance with another embodiment of the present invention. In the present embodiment, the reference numbers similar to those in the embodiment illustrated in FIG. 1A through FIG. 1F indicate the same features. In the fabrication of a light-emitting diode structure, an epitaxial growth substrate 100 is firstly provided. Next, an illuminant epitaxial structure including an n-type semiconductor layer 106, an active layer 108 and a p-type semiconductor layer 110 covering the surface 102 of the epitaxial growth substrate 100 in sequence is formed by, for example, an epitaxial growth method.

Then, the illuminant epitaxial structure is patterned to remove a portion of the p-type semiconductor layer 110 and a portion of the active layer 108 until at least exposing a portion of the n-type semiconductor layer 106, so as to form an opening 144 in the illuminant epitaxial structure. In one embodiment, a bottom surface 166 of the opening 144 formed in the patterning step exposes a portion of the n-type semiconductor layer 106. Therefore, referring to FIG. 2A, an etching material layer 146 on the surface 102 of the epitaxial growth substrate 100 is a part of the n-type semiconductor layer 106.

Figure 2A:
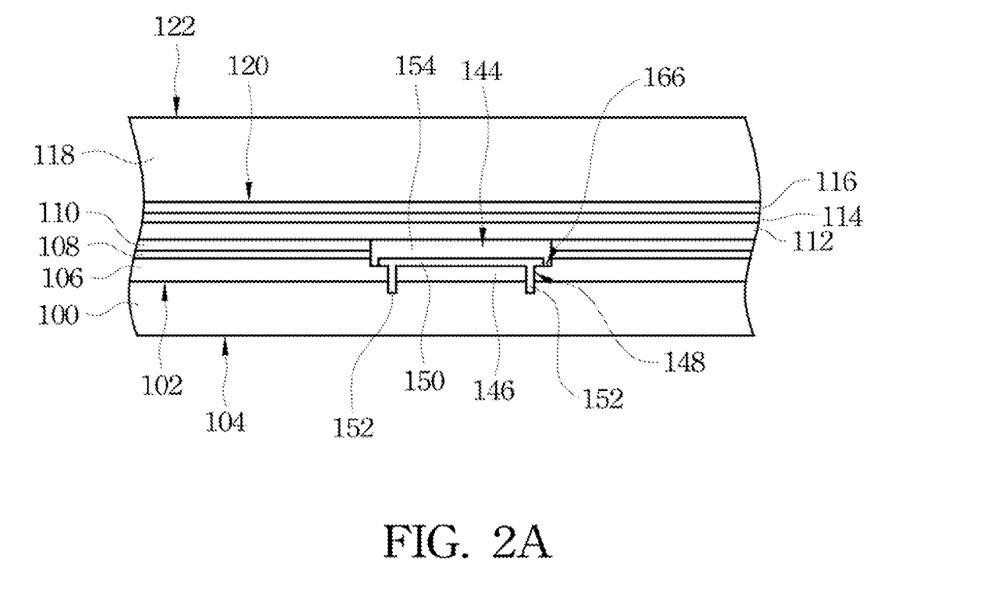
FIG. 2A through FIG. 2F are schematic flow diagrams showing a process for manufacturing a light-emitting diode structure in accordance with another embodiment of the present invention.

In another embodiment, the patterning step may remove a portion of the n-type semiconductor layer 106, so that the surface 102 of the epitaxial growth substrate 100 is exposed by the opening 144. After the patterning step, an etching material layer 146 is formed to cover the exposed portion of the surface 102 of the epitaxial growth substrate 100 by, for example, a film deposition method. A material of the etching material layer 146 may be, for example, $SiO_2$, $SiN_x$, $TiO_2$ or $Al_2O_3$. In one embodiment, a bottom surface 166 of the opening 144 is a top surface of the etching material layer 146.

Then, a metal layer 148 is formed by using the techniques including photolithography, etching and disposition. The metal layer 148 is at least disposed on the bottom surface 166 of the opening 144. As a result, the etching material layer 146 is positioned between the metal layer 148 and the surface 102 of the epitaxial growth substrate 100. In addition, the metal layer 148 contacts the n-type semiconductor layer 106, so that the metal layer 148 is electrically connected to the n-type semiconductor layer 106.

Referring to FIG. 2A, in one embodiment, the metal layer 148 includes a first portion 150 and two second portions 152. The second portions 152 are respectively connected to two opposite sides of the first portion 150, and extend from the first portion 150 to the surface 102 of the epitaxial growth substrate 100 at locations between the n-type semiconductor layer 106 and the etching material layer 146. As a result, the metal layer 148 is a U-like shape structure. In one embodiment, the second portions 152 contact the surface 102 of the epitaxial growth substrate 100. In another embodiment, the second portions 152 extend into the epitaxial growth substrate 100, so that one end of each second portion 152 is embedded in the epitaxial growth substrate 100.

Next, an insulation layer 154 is formed by, for example, a film deposition method to cover the metal layer 148 and the bottom surface 166 of the opening 144 and to fill the opening 144, so as to electrically isolate the metal layer 148 and the p-type semiconductor layer 110. The insulation layer 154 may be a single-layered structure or a multi-layered structure. In one embodiment, a material of the insulation layer 154 may be, for example, $SiO_2$, $SiN_x$, $TiO_2$, $Al_2O_3$ or $TiN_x$.

In one embodiment, a p-type contact layer 112 may be selectively formed to cover the p-type semiconductor layer 110 and the insulation layer 154. An ohmic contact may be formed between the p-type contact layer 112 and the p-type semiconductor layer 110. According to the product requirement, a reflective layer 114 may be selectively formed to cover the p-type contact layer 112 to reflect the light emitted from the active layer 108. In addition, according to the process requirement, a bonding layer 116 may be selectively formed to bond the reflective layer 114 and the bonding substrate 118. In one embodiment, the bonding layer 116 may be firstly formed on the reflective layer 114 on the p-type semiconductor layer 110. In another embodiment, the bonding layer 116 may be firstly formed on the surface 120 of the bonding substrate 118. Next, referring to FIG. 2A, the surface 120 of the bonding substrate 118 may be bonded to the reflective layer 114 on the p-type semiconductor layer 110 by the bonding layer 116. The bonding substrate 118 further includes another surface 122 opposite to the surface 120.

In some embodiments, after completing the bonding process of the bonding substrate 118 and the p-type semiconductor layer 110, a polishing step may be selectively performed on the surface 104 of the epitaxial growth substrate 100 to decrease the thickness of the epitaxial growth substrate 100 according to the product requirement. The thickness of the polished epitaxial growth substrate 100 may range between 1 μm and 300 μm.

Figure 2B:
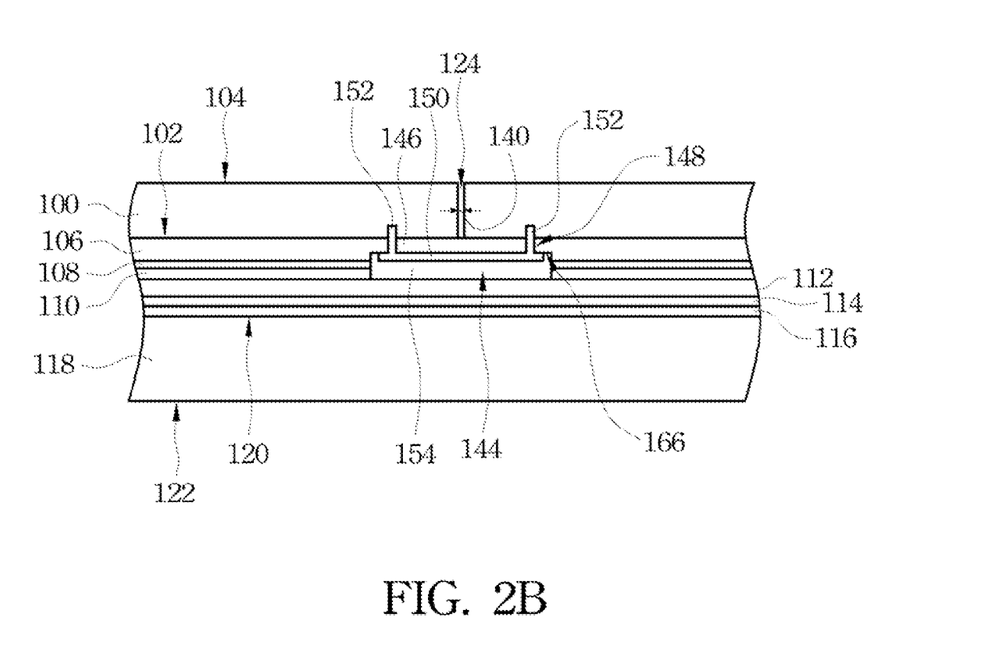

In order to illustrate the sequential process clearly, FIG. 2B to FIG. 2F illustrate the diagrams when FIG. 2A is turned upside down. Then, such as shown in FIG. 2B, a portion of the epitaxial growth substrate 100 is slit from the surface 104 of the epitaxial growth substrate 100 by, for example, laser to form a slit 124 penetrating the epitaxial growth substrate 100 to expose a portion of the etching material layer 146. In one embodiment, the slit 124 does not extend into the etching material layer 146, such as FIG. 2B. In another embodiment, the slit 124 may extend into the etching material layer 146.

Figure 2C:
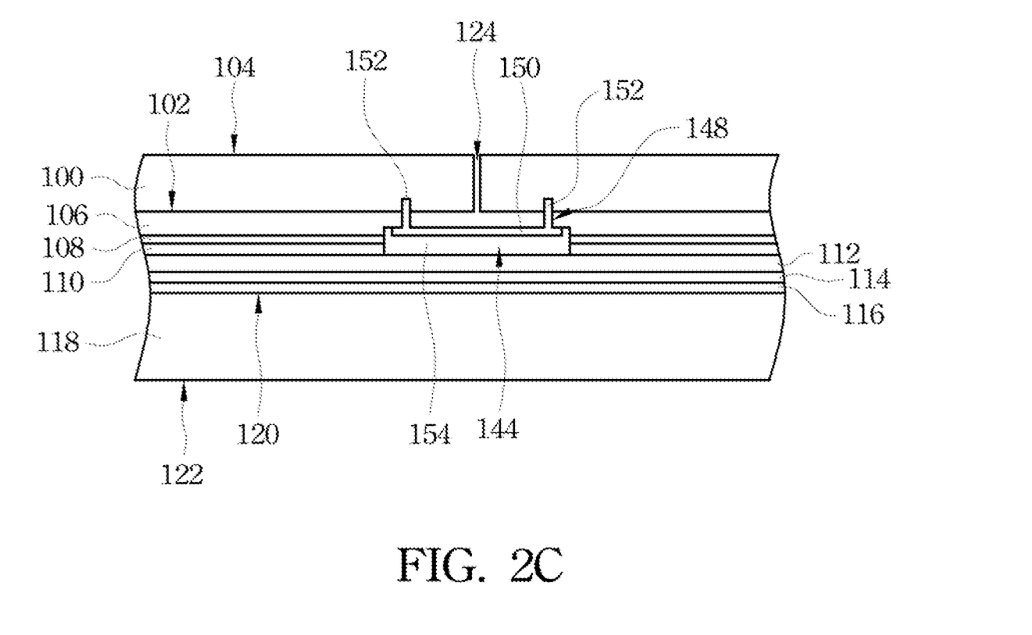

Then, an etching step is performed to etch the etching material layer 146 through the slit 124 with an etchant by, for example, a wet etching technique. The etchant may flow along the interface between the epitaxial growth substrate 100 and the etching material layer 146 to laterally etch and remove the etching material layer 146 from a bottom surface of the slit 124 toward the outer of the slit 124. In the present embodiment, the etching step may use the first portion 150 of the metal layer 148 as an etching stop structure in the lengthwise etching direction, and may use the second portions 152 of the metal layer 148 as etching stop structures in the lateral etching direction for the benefit of precisely controlling the etching endpoint. After the etching step, the epitaxial growth substrate 100 near the slit 124 includes an overhang 156 overhanging the metal layer 148, such as shown in FIG. 2C. In one embodiment, the etchant may include a combination composed of $H_2SO_4$ and $H_3PO_4$, KOH, NaOH, buffered oxide etcher (BOE) or HF.

Figure 2D:
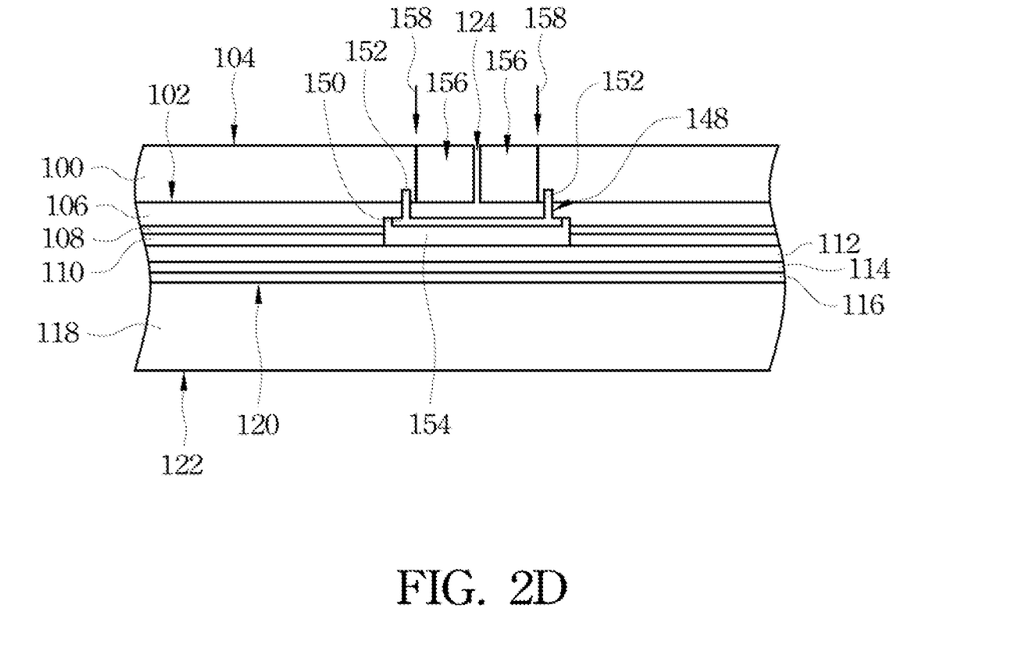

Then, such as shown in FIG. 2D, the overhang 156 of the epitaxial growth substrate 100 may be cut off by laser 158 to remove the overhang 156 of the epitaxial growth substrate 100 to form an opening 160 in the epitaxial growth substrate 100. In the embodiment illustrated in FIG. 2D, the overhang 156 of the epitaxial growth substrate 100 is not removed completely, and a portion of the overhang 156 may overhang the opening 160. In another embodiment, the entire overhang 156 of the epitaxial growth substrate 100 may be removed.

Figure 2E:
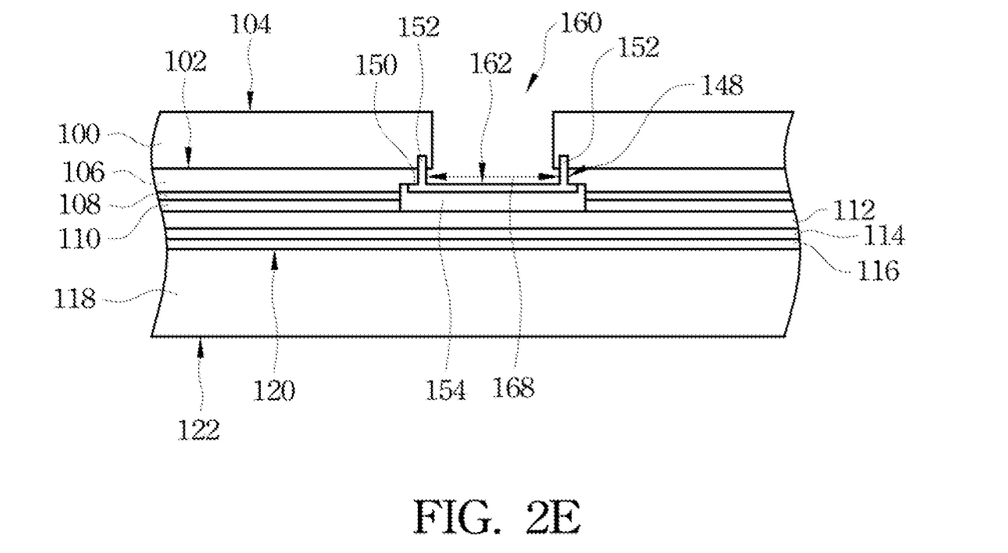

As shown in FIG. 2E, after the overhang 156 of the epitaxial growth substrate 100 is removed, the opening 160 formed in the epitaxial growth substrate 100 exposes a portion 162 of the metal layer 148. The width 168 of the exposed portion 162 of the metal layer 148 may be larger than 30 µm, for example.

Figure 2F:
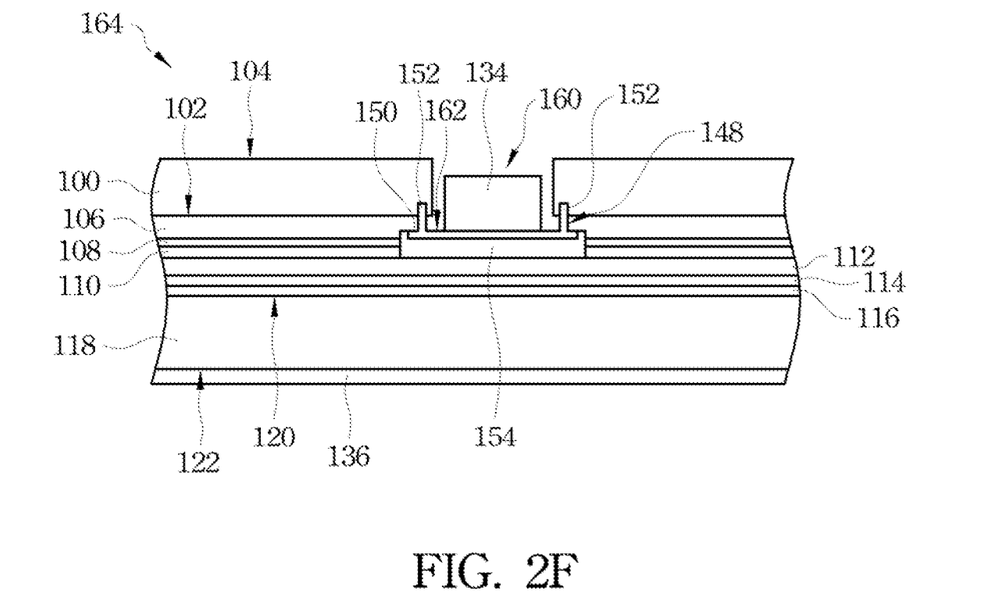

Then, the bonding substrate 118 may be selectively polished from the surface 122 of the bonding substrate 118 to reduce the thickness of the bonding substrate 118 according to the product requirement. Next, such as shown in FIG. 2F, an n-type electrode 134 and a p-type electrode 136 are formed by, for example, an evaporation method to complete the fabrication of a light-emitting diode structure 164. In one embodiment, the n-type electrode 134 may only be disposed on the exposed portion 162 of the metal layer 148, as shown in FIG. 2F. In another embodiment, a portion of the n-type electrode 134 may be disposed on the exposed portion 162 of the metal layer 148, and another portion of the n-type electrode 134 may be disposed on the surface 104 of the epitaxial growth substrate 100. The p-electrode 136 covers the surface 122 of the bonding substrate 118. The n-type electrode 134 is electrically connected to the n-type semiconductor layer 106, and the p-electrode 136 is electrically connected to the bonding substrate 118. The n-type electrode 134 is preferably in ohmic contact with the n-type semiconductor layer 106, and the p-electrode 136 is preferably in ohmic contact with the bonding substrate 118.

According to the aforementioned embodiments of the present invention, one advantage of the present invention is that in the method for manufacturing a light-emitting diode structure, only a portion of an epitaxial growth substrate is removed. Therefore, the stress induced when the epitaxial growth substrate is removed can be greatly reduced, thereby effectively decreasing the damage of an epitaxial structure caused when the epitaxial growth substrate is removed.

According to the aforementioned embodiments of the present invention, another advantage of the present invention is that the laser only contacts a small portion of an epitaxial structure or an etching material layer, so that the damage to the epitaxial structure can be greatly eliminated to increase the process yield.

According to the aforementioned embodiments of the present invention, still another advantage of the present invention is that a portion of an epitaxial structure or an etching material layer contacting with the laser is removed in the following etching step, so that the degradation of the illumination efficiency resulting from the damage of the epitaxial structure can be eliminated. Therefore, the light-emitting diode structure of the present invention has superior illumination efficiency and high reliability.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode structure, including:
    a p-type electrode;
    a bonding substrate disposed on the p-type electrode;
    a p-type semiconductor layer disposed on the bonding substrate;
    an active layer disposed on the p-type semiconductor layer;
    an n-type semiconductor layer disposed on the active layer;
    an epitaxial growth substrate disposed on the n-type semiconductor layer, wherein the epitaxial growth substrate includes an opening penetrating the epitaxial growth substrate and an overhang projecting in the opening; and
    an n-type electrode disposed in the opening and electrically connected to the n-type semiconductor layer.

2. The light-emitting diode structure according to claim 1, further including a bonding layer between the bonding substrate and the p-type semiconductor layer.

3. The light-emitting diode structure according to claim 1, further including a reflective layer between the bonding substrate and the p-type semiconductor layer.

4. The light-emitting diode structure according to claim 1, further including a p-type contact layer between the bonding substrate and the p-type semiconductor layer.

5. The light-emitting diode structure according to claim 1, wherein the opening exposes a portion of the n-type semiconductor layer, and the n-type electrode is disposed on the portion of the n-type semiconductor layer.

6. The light-emitting diode structure according to claim 1, further including:
    an insulation layer disposed on the bonding substrate under the opening; and
    a metal layer disposed on the insulation layer, wherein the opening exposes the metal layer.

7. The light-emitting diode structure according to claim 6, wherein the n-type electrode is disposed on the metal layer.

8. The light-emitting diode structure according to claim 6, wherein the metal layer includes a first portion and two second portions, and the second portions are respectively connected to two opposite sides of the first portion to form a U-like shape structure.

9. The light-emitting diode structure according to claim 8, wherein one end of each of the second portions is embedded into the epitaxial growth substrate.

* * * * *